United States Patent
Lutker-Lee et al.

(10) Patent No.: US 11,837,471 B2
(45) Date of Patent: Dec. 5, 2023

(54) METHODS OF PATTERNING SMALL FEATURES

(71) Applicant: Tokyo Electron Limited, Tokyo (JP)

(72) Inventors: Katie Lutker-Lee, Albany, NY (US);
Jake Kaminsky, Albany, NY (US);
Yu-Hao Tsai, Albany, NY (US);
Angelique Raley, Albany, NY (US);
Mingmei Wang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 186 days.

(21) Appl. No.: 17/118,107

(22) Filed: Dec. 10, 2020

(65) Prior Publication Data

US 2021/0183656 A1 Jun. 17, 2021

Related U.S. Application Data

(60) Provisional application No. 62/949,253, filed on Dec. 17, 2019.

(51) Int. Cl.
| | | |
|---|---|---|
| *H01L 21/033* | (2006.01) | |
| *H01L 21/027* | (2006.01) | |
| *G03F 7/20* | (2006.01) | |

(52) U.S. Cl.
CPC ...... *H01L 21/0338* (2013.01); *H01L 21/0274* (2013.01); *H01L 21/0332* (2013.01); *H01L 21/0335* (2013.01); *H01L 21/0337* (2013.01); *G03F 7/2004* (2013.01)

(58) Field of Classification Search
CPC ............. H01L 21/0332; H01L 21/0335; H01L 21/0337; H01L 21/0338
See application file for complete search history.

(56) References Cited

U.S. PATENT DOCUMENTS

| | | | |
|---|---|---|---|
| 9,520,270 B2 | 12/2016 | Mohanty et al. | |
| 9,607,834 B2 | 3/2017 | Matsumoto et al. | |
| 2013/0237059 A1* | 9/2013 | Ranjan | H01L 21/0206 257/E21.214 |
| 2014/0134848 A1 | 5/2014 | Hisamatsu et al. | |
| 2015/0228497 A1* | 8/2015 | De Schepper | H01L 21/3086 438/694 |
| 2016/0379824 A1 | 12/2016 | Wise et al. | |
| 2019/0198338 A1* | 6/2019 | Kim | H01L 21/02164 |

FOREIGN PATENT DOCUMENTS

| | | |
|---|---|---|
| EP | 2608247 A1 | 1/2012 |
| JP | 6017928 B2 | 11/2016 |
| KR | 20150093618 A | 8/2015 |
| KR | 20170000361 A | 1/2017 |
| WO | 2018213318 A1 | 11/2018 |

* cited by examiner

*Primary Examiner* — Walter H Swanson
(74) *Attorney, Agent, or Firm* — Slater Matsil, LLP

(57) ABSTRACT

A method of forming a semiconductor device includes depositing a first layer over a substrate and patterning the first layer using an extreme ultraviolet (EUV) lithography process to form a patterned layer and expose portions of the substrate. The method includes, in a plasma processing chamber, generating a first plasma from a gas mixture including SiCl4 and one or more of argon, helium, nitrogen, and hydrogen. The method includes exposing the substrate to the first plasma to deposit a second layer including silicon over the patterned layer.

18 Claims, 7 Drawing Sheets

METHODS OF PATTERNING SMALL FEATURES

CROSS REFERENCE TO RELATED PATENTS AND APPLICATIONS

This application claims priority to and the benefit of the filing date of U.S. Provisional Patent Application No. 62/949,253, filed Dec. 17, 2019, which application is incorporated herein by reference in its entirety.

TECHNICAL FIELD

The present invention relates generally to forming small features, and, in particular embodiments, to methods of patterning small features.

BACKGROUND

Generally, semiconductor devices, such as integrated circuits (IC's) are fabricated by sequentially depositing and patterning layers of dielectric, conductive, and semiconductor materials over a semiconductor substrate using photolithography and etch to form structures for circuit components and interconnect elements (e.g., transistors, resistors, capacitors, metal lines, contacts, and vias). At each successive technology node, feature sizes are shrunk to roughly double the component packing density. A direct method for printing the higher resolution patterns is to reduce the wavelength of the light source. The 248 nm deep ultraviolet (DUV) radiation source (KrF laser), used to expose critical patterns at the 250 nm and 130 nm nodes, was replaced by the 193 nm ArF laser, starting at the 90 nm node. Features down to 35 nm may be printed using 193 nm lithography with resolution enhancement techniques, such as immersion lithography. The 193 nm optics is further extended to 14 nm and even 10 nm nodes using multiple patterning techniques, but at higher cost and processing complexity associated with the additional masks. At the sub-10 nm regime, DUV may be replaced by the even shorter 13.5 nm wavelength extreme ultraviolet (EUV) technology. While EUV promises high resolution with fewer masks, it has to bring together all the components of a lithography system (radiation source, scanner, mask, and resist), overcoming each component's engineering hurdles. One major issue is that resists exposed with EUV radiation are sensitive to stochastic effects resulting in random failures in printing the extremely small areas and fine lines of sub-10 nm designs. Further innovations are needed in this area for successful deployment of EUV lithography in high volume semiconductor IC manufacturing.

SUMMARY

A method of forming a semiconductor device includes depositing a first layer over a substrate and patterning the first layer using an extreme ultraviolet (EUV) lithography process to form a patterned layer and expose portions of the substrate. The method includes, in a plasma processing chamber, generating a first plasma from a gas mixture including $SiCl_4$ and one or more of argon, helium, nitrogen, and hydrogen. The method includes exposing the substrate to the first plasma to deposit a second layer including a material comprising silicon over the patterned layer.

A method of forming a semiconductor device includes depositing a first layer over a substrate; patterning the first layer using an extreme ultraviolet (EUV) lithography process to form a patterned layer and expose portions of the substrate. The method includes, using a first plasma process including $SiCl_4$, performing a first deposition process to deposit a second layer over the patterned layer and the exposed portions of the substrate, the second layer including a material comprising silicon. The method includes, using a second plasma process, performing a first trim process to remove portions of the second layer to expose the portions of the substrate. The method includes, using the remaining portions of the second layer as an etch mask, etching the substrate to form a patterned feature.

A method of forming a semiconductor device includes depositing a first layer over a substrate and patterning the first layer using an extreme ultraviolet (EUV) lithography process to form a patterned layer and expose portions of the substrate. The method includes, using a first plasma process including $SiCl_4$, selectively depositing a second layer over the patterned layer. The method includes, using the second layer as an etch mask, etching the substrate to form a patterned feature.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
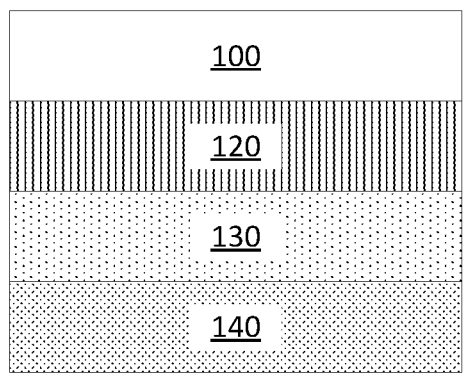
FIGS. 1A-1F illustrate cross-sectional views of a semiconductor device at various intermediate stages of an example sequence of process steps used to form a patterned etch mask and transfer the pattern to an underlying layer, in accordance with an embodiment of the invention.

The present invention relates generally to methods of forming patterned etch masks, and, in particular embodiments, to methods to form smooth patterned etch mask having high etch selectivity to form nanometer scale patterns.

The shorter 13.5 nm wavelength used in EUV lithography may offer a high resolution single patterning capability, for example, printing a dense array of 13 nm resist lines and spaces (26 nm pitch) using only one mask. In contrast, two to four masks may be used to achieve an equivalent resolution with 193 nm DUV lithography using multiple patterning techniques. It is estimated that manufacturing a typical IC design at the 7 nm node would be an unacceptably long and expensive process requiring more than 80 DUV 193 nm masks, whereas EUV may bring the mask count down to a more manageable range of about 60 masks. However, EUV technology has a number of engineering difficulties arising from the high energy of photons at the short 13.5 nm wavelength, as known to persons skilled in the art. This disclosure describes embodiments of methods to mitigate some of these issues.

One issue with the 14.3 times higher energy of the EUV photon (92 eV vs. 6.4 eV) is the correspondingly lower number of photons available at a fixed exposure to define the edges of an exposed region. For example, a 1 nm$^2$ area of EUV photoresist is exposed to an average of just 10 photons for 15 mJ/cm$^2$ exposure compared to 143 photons for 193 nm DUV resist. However, some regions would randomly receive more than the average number of photons while other regions would receive less. Besides, as the scanner steps from die to die, the same region on each die on the wafer could receive randomly different exposures. The random variation in the photon count, also known as shot noise, follows a Poisson process, resulting in exposure fluctuations having a percentage variation (ratio of the root mean squared value to the average value (□□□)) that is √(14.3) or about 3.8 times larger in EUV lithography relative to DUV at the same exposure level. The impact of exposure fluctuations on the exposed pattern gets aggravated as the feature sizes get smaller. The randomness in the locations where the photons interact with the resist to cause chemical reactions translates to a corresponding blurring of the edge of an exposed line. This loss of resolution is more severe for EUV (relative to DUV) because the mean distance between the locations of photon-resist interactions increases as the photon density is reduced.

Another issue associated with the high photon energy is that a photon absorption event (within the resist or a layer underlying the resist layer) is accompanied by generation of high-energy photoelectrons that quickly cascade into secondary emission of lower energy electrons. As these electrons get scattered around in a stochastic process along random trajectories, often referred to as random walk, some may cause chemical reactions in the resist considerably far from where the original photon was absorbed. As a result, there may be a random secondary exposure over a region beyond the boundaries defined by the original pattern. This secondary exposure is another stochastic process creating a random pattern superimposed on the image generated exclusively from the photon-resist interactions.

The impact of the unwanted resist stochastics, such as shot noise and secondary electron exposure include random loss of resolution and image contrast degradation, and observable line edge roughness (LER) and linewidth roughness (LWR). These problems (e.g., LER and LWR) may be mitigated by using embodiments described in this disclosure that provide inventive methods, wherein a patterned EUV photoresist may be coated with a smoothing film using plasma processing techniques.

Low etch selectivity provided by a patterned EUV resist etch mask is yet another problem that may be mitigated by using embodiments of the invention described in this disclosure. A process flow for fabrication of semiconductor devices (e.g., semiconductor IC's) comprises multiple instances where a pattern imprinted on a photomask is transferred to a target layer in a semiconductor substrate by etching the target layer using a patterned etch mask. The first step in transferring the pattern from the photomask to the semiconductor substrate (e.g., a semiconductor wafer) is to form a patterned photoresist film, which is then used as an etch mask in a subsequent etch step that selectively removes material from underlying layers in the exposed regions unprotected by the patterned resist. The resist loss during this etching process has to be limited in order for the resist mask to ensure that the protected region is not damaged by the etchants. While, for this purpose, it is advantageous to use a thick resist film, there are tradeoffs involved due to which the EUV resist films are relatively thin, as explained herein. For example, increasing the resist thickness may result in an undesirable vertically non-uniform exposure. The radiation intensity reduces progressively with penetration depth as photons get absorbed by the resist material. The progressively reducing exposure dose towards the bottom may result in an undesirably sloped resist profile, once the resist is developed. Furthermore, a thicker resist implies fewer photons reaching the bottom region, hence resulting in an undesirably amplified shot noise. The degree of vertical non-uniformity depends also on the photon absorbance of the resist material; a higher absorbance resulting in increased non-uniformity. However, because of the low number of EUV photons, the absorbance of EUV resists may be maintained high enough to provide sufficient sensitivity at a reasonable exposure dose. Excessive exposure dose may lead to various issues such as overheating and outgassing. Generally, the resist thickness is selected as low as possible to provide more transparency to minimize vertical non-uniformity effects in order to achieve near-vertical resist profiles. The thickness may also be limited by resist collapse at high aspect ratios and by resist strip considerations.

It is advantageous to increase the etch selectivity of the patterned etch mask in order to overcome the limitations on increasing the EUV resist thickness. The embodiments described in this disclosure provide the advantage of high etch selectivity by selectively increasing the etch mask thickness vertically, but with minimal change in the lateral dimensions (e.g., linewidth, line-to-line space, size of a hole, etc.). In one embodiment, an increased height for the etch mask is obtained by selectively depositing material over the patterned resist film using plasma processing techniques.

An example embodiment of a method by which the LER and LWR of patterned resist lines may be improved and the etch selectivity of the pattern (when used as an etch mask) be increased is described with reference to FIGS. 1A-1F and FIG. 2. FIGS. 1A-1F illustrate the processing steps with cross-sectional views of a semiconductor device at various intermediate stages of an example sequence of process steps used to form the patterned etch mask and transfer the pattern to an underlying layer. FIG. 2 illustrates a more general flowchart of the processing sequence shown in FIG. 1.

Figure 2:
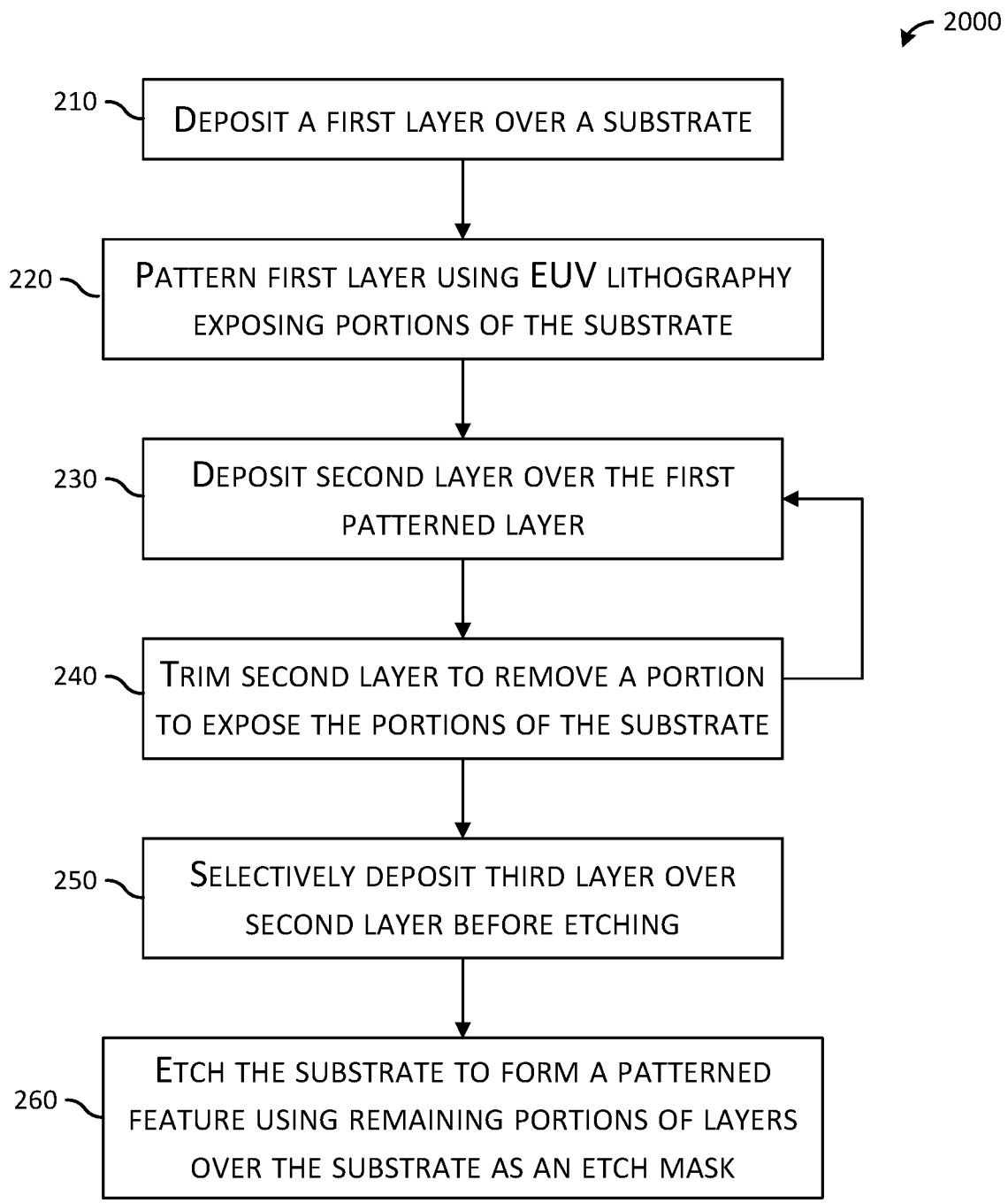
FIG. 2 is a flowchart illustrating an example process flow used to form a patterned etch mask and transfer the pattern to an underlying layer, in accordance with an embodiment of the invention.

FIG. 1A shows a multilayer semiconductor device, wherein the topmost layer is a first layer 100 formed over a semiconductor substrate. The first layer 100 may be a sacrificial photoresist film coated over an underlying layer 120 in the semiconductor substrate. In this example, the first layer 100 may be an organic photoresist or a metal oxide photoresist film sensitive to EUV radiation in the wavelength range of 10 nm to about 14 nm, typically 13.5 nm. The pattern in the photomask may be transferred to the first layer 100 by exposing the first layer 100 to radiation, e.g., EUV radiation. The layer to which the pattern from the photoresist is to be transferred first is referred to as the underlying layer 120 in this disclosure. The etch mask used to etch the underlying layer 120 may include additional sacrificial layers (in addition to the photoresist film) formed subsequent to patterning the first layer 100, as described in detail further below. Generally, the entire etch mask is stripped immediately after completing etching the underlying layer 120. After the underlying layer 120 has been patterned, it may be used as a hard mask to transfer the pattern further to a target layer 130 shown immediately below the underlying layer 120 in FIG. 1A. Target layer 130 is shown formed over a semiconductor wafer 140.

The underlying layer 120 may be a stack of films comprising, for example, an underlay adjacent to the first layer 100 and one or more hard mask layers below the underlay. The first layer 100 may be a photoresist film and the underlay (included in the underlying layer 120) may be a bottom anti-reflective coating (BARC) such as SiARC, organic BARC, and metal-oxide films. The underlying layer 120 may comprise films of dielectric and/or conductive materials, such as silicon oxide, silicon nitride, silicon oxynitride, silicon carbide, titanium nitride, tantalum nitride, their alloys, and combinations thereof. In some embodiments, the underlying layer 120 may be a sacrificial layer that is removed after being used as a hard mask in a subsequent etch step. The target layer 130 may be, for example, an intermetal dielectric (IMD) comprising a low-k dielectric material, and the semiconductor wafer 140 may include multiple interconnect levels comprising dielectric films with embedded conductive interconnect elements formed over a single-crystal bulk semiconductor or semiconductor-on-insulator (SOI) wafer in which various active devices may be fabricated.

Figure 1B:
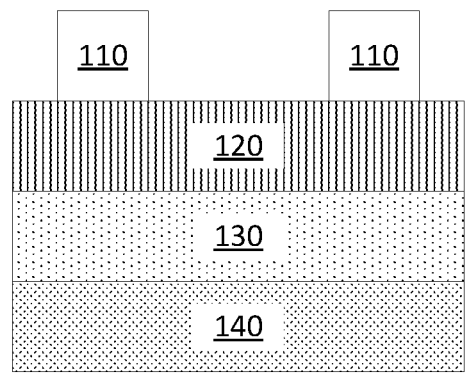

In one embodiment, the first layer 100 comprises photoresist. In FIG. 1B, the photoresist is exposed and developed to transfer a pattern design from a photomask to the photoresist, thereby forming a patterned resist film 110 using, for example, 13.5 nm wavelength EUV lithography process steps known to people skilled in the art. As explained above, in one embodiment, wherein EUV lithography is used, the patterned resist film 110 may be having an undesirably high LER and LWR. In the embodiment illustrated in FIGS. 1A-1F, the LER/LWR of the masking pattern may be reduced by forming a thin smoothing film covering the patterned resist film 110. Although, in this example, the patterned features are referred to as lines and the photolithography process uses 13.5 nm EUV radiation, the methods described in this disclosure may be applied to pattern other geometries (e.g., holes for contacts and vias), and may be using longer wavelength radiation, for example, vacuum ultraviolet (VUV) radiation in the 100 nm to 200 nm range. Roughness along the edges of holes is sometimes referred to as contact edge roughness (CER).

Figure 1C:
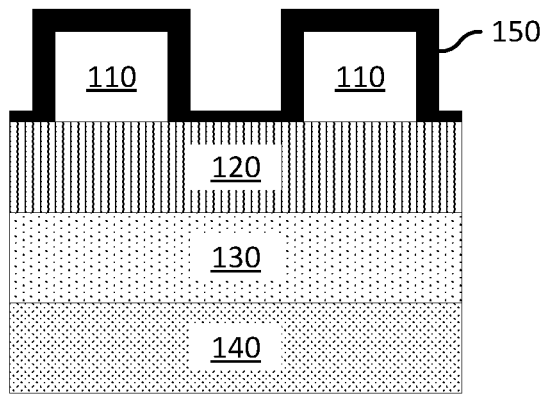

FIG. 1C illustrates a second layer formed over the top surfaces of the structure illustrated in FIG. 1B. The second layer is a, thin, smoothing film 150. In one embodiment the material used for the smoothing film 150 may comprise an organic polymer such as those made in a plasma chamber (e.g., fluorocarbons or hydrocarbons). In another embodiment, material comprising silicon may be used to form the smoothing film 150, and at least a portion thereof may be subsequently oxidized by exposure to oxygen (e.g., exposure to air), or otherwise subsequently treated to change its composition. In some embodiment, a thin film of materials such as silicon, or silicon oxide, or silicon nitride may be deposited over the patterned resist film 110 and the underlying layer 120 to form the smoothing film 150. As illustrated in FIG. 1C, the smoothing film 150 is deposited thicker over the sidewalls and tops of the patterned resist film 110 compared to the thickness deposited over the surface of the underlying layer 120 in between the regions covered by resist using, for example, a plasma-enhanced chemical vapor deposition (PECVD) process with tunable conformity. Such a film may be formed either in a dedicated deposition tool or in a plasma etch chamber.

A ratio of the thickness of the deposited smoothing film 150 over the patterned resist film 110 to that of the thickness of the deposited smoothing film 150 over the underlying layer 120 may be about 5:1 to about 1.1:1. The deposited smoothing film 150 may be trimmed using, for example, isotropic plasma etch processing, gas phase etching, or wet etching. In some embodiments, multiple cycles of deposition and trim may be performed to form the final trimmed smoothing film 160, illustrated in FIG. 1D. The trimmed smoothing film 160 may expose a portion of the top surface of the underlying layer 120 while covering the sidewalls and top surfaces of the patterned resist film 110.

Figure 1D:
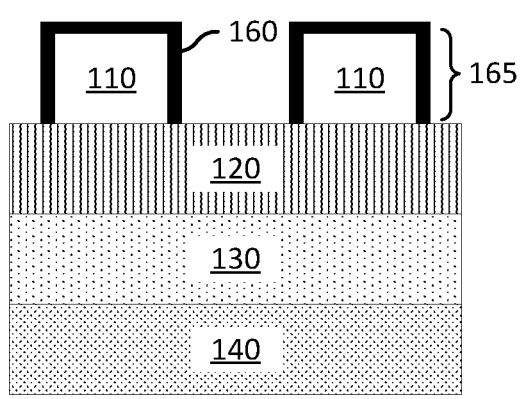

One advantage of forming the trimmed smoothing film 160 is a reduced surface and edge roughness of the patterned structure illustrated in FIG. 1D relative to the patterned structure illustrated in FIG. 1B. A reduction in the root mean squared (rms) values of LER and LWR of about 10% to about 70% may be obtained by using this process. Accordingly, in various embodiments, the smoothing film 150 has a line edge roughness value that is less than a line edge roughness value of the patterned resist film 110 about 10% to about 70%.

At the intermediate stage of fabrication, illustrated in FIG. 1D, the partially formed etch mask 165, comprising the patterned resist film 110 encapsulated by the trimmed smoothing film 160, may be having a total height of about 15 nm to about 60 nm above the underlying layer 120. In the example application, illustrated in FIG. 1A-1F, the pattern of the patterned resist film 110 is intended to be transferred to the underlying layer 120 by removing material vertically from below the exposed surface of the underlying layer 120 to expose a top surface of the target layer 130 disposed below the underlying layer 120. The thickness of the partially formed etch mask 165 may not provide enough etch selectivity to remove material to a depth sufficient to expose the surface of the target layer 130. In various patterning applications, the selected thickness of a patterned EUV resist film is too low to be used as a robust etch mask for the etch process that may be used to pattern a hard mask layer below the etch mask, such as the partially formed etch mask 165.

Figure 1E:
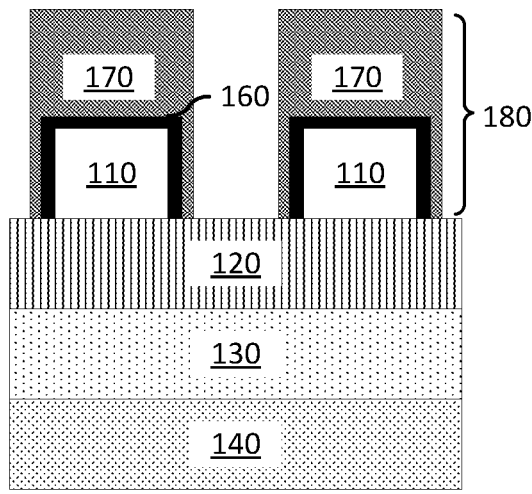

In FIG. 1E, the lack of etch selectivity due to the low thickness of the partially formed etch mask 165 is addressed by selectively depositing a third layer over the trimmed smoothing film 160. The third layer is a height-enhancing film 170 formed using a selective deposition PECVD process to increase the height of the etch mask from that of the partially formed etch mask 165 to that of the final etch mask 180, as illustrated in FIG. 1E. The process gases may include silicon tetrachloride and hydrogen, and the carrier gases may include one or more gases such as helium, argon, and nitrogen. Other silicon containing gases such as silicon tetrafluoride may also be used. The deposited material may comprise silicon and at least a portion thereof may be subsequently oxidized by exposure to oxygen (e.g., exposure to air). In embodiments where nitrogen gas is used, nitrogen atoms may get incorporated in the deposited film. The selective deposition PECVD process may be tuned for selectivity, conformality, profile, and deposition rate based on standard plasma etch parameters such as chamber pressure, chamber temperature, RF source power, RF bias power, RF waveform (e.g., continuous wave RF, pulsed RF, square pulse, sawtooth pulse, and the like), and the composition and flow rates of various process and carrier gases.

In one embodiment, the flow rate for silicon tetrachloride may be about 5 sccm to about 20 sccm, typically, 10 sccm; the flow rate for hydrogen may be about 1 sccm to about 300 sccm, typically, 240 sccm; and the flow rate for argon may be about 50 sccm to about 1000 sccm, typically, 290 sccm. In other embodiments argon and/or hydrogen may not be present in the gas mixture flowing in the plasma processing chamber. In one embodiment, the RF source power may be about 200 W to about 1000 W, typically in one embodiment of about 500 W. The chamber pressure may be about 10 mT to about 500 mT, typically in one embodiment of about 50 mT. The deposition may be performed at a temperature between 0° C. and 100° C., for example, 30° C.

As illustrated in FIG. 1E, the deposition process may be adjusted such that, in the final etch mask 180, the thickness of the height-enhancing film 170 deposited on the flat top surface of the trimmed smoothing film 160 is much higher than the thickness deposited on the sidewalls. A ratio of the thickness of the height-enhancing film 170 over the flat top surface of the trimmed smoothing film 160 to that of the thickness of the height-enhancing film 170 over the sidewalls may be about 5:1 to about 100:1.

Also, as illustrated in FIG. 1E, the final etch mask 180 exposes a portion of the top surface of the underlying layer 120 in between the regions covered by the partially formed etch mask 165. In some embodiments, the height-enhancing film 170 may undergo a trim etch process or multiple cycles of selective deposition and trim in order to achieve the desired geometry.

Figure 1F:
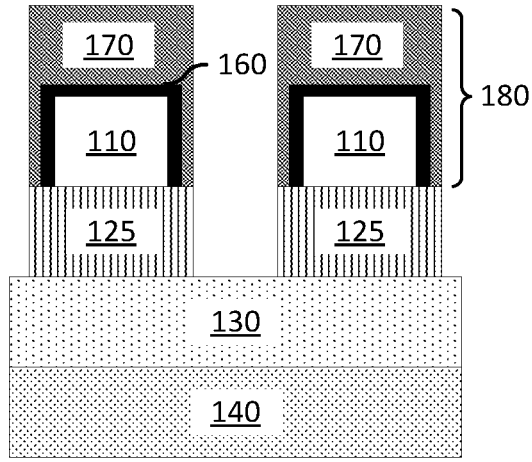

FIG. 1F illustrates a cross-sectional view of the etch mask after an anisotropic etch process, for example, a plasma reactive ion etch (RIE) process, is used to pattern the underlying layer 120. The patterned underlying layer 125 forms a patterned hard mask which exposes a portion of the top surface of the target layer 130. In this example, the etch selectivity provided by the final etch mask 180 is high enough to leave residual material from the height-enhancing film 170 over the top surface of the trimmed smoothing film 160. Accordingly, as illustrated in FIG. 1F, there is no resist loss in forming the patterned underlying layer 125 by etching the underlying layer 120.

The process sequence described with reference to FIG. 1A-1F is summarized in a more general fabrication flow, referred to as a first fabrication flow 2000 illustrated by the flowchart in FIG. 2. The initial step in the first fabrication flow 2000 may be depositing a first layer 100 (e.g., the photoresist film mentioned with reference to FIG. 1A), as indicated in block 210. In block 220 the first layer may be patterned, as described above with reference to FIG. 1B. A second layer (e.g., the smoothing film 150 in FIG. 1C) may be deposited over the patterned first layer (e.g., the patterned resist film 110 in FIG. 1B), as indicated in block 230. Block 240 represents the trim etch, described above with reference to FIG. 1D. As indicated in the flowchart in FIG. 2, the first fabrication flow 2000 may cycle through multiple cycles of the deposition and etch steps mentioned in blocks 230 and 240. In block 250, a third layer (e.g., the height-enhancing film 170 in FIG. 1E) may be selectively deposited over the trimmed second layer (e.g., the trimmed smoothing film 160 in FIG. 1D). Then, as indicated in the last block 260 of the first fabrication flow 2000, the final etch mask (e.g., the final etch mask 180 in FIG. 1E) may be used to form patterned features in the substrate (e.g., the patterned underlying layer 125 in FIG. 1F).

The method described with reference to FIGS. 1 and 2 provides the additional advantage of independently optimizing the smoothing process and the process for increasing etch selectivity by decoupling the technique used for reducing LER/LWR of an etch mask from the technique used to increase its height to increase etch selectivity. The decoupling is achieved by using process steps to form the trimmed smoothing film 160 that are independent of the process steps used to form the height-enhancing film 170, as described above. However, this advantage of process flexibility is obtained at a higher processing cost.

An alternative embodiment is described with reference to the cross-sectional views in FIGS. 3A-3C and the flowchart in FIG. 4, wherein the steps associated with depositing the second layer (mentioned in block 230 in FIG. 2) to form a separate smoothing film, such as the trimmed smoothing film 160, illustrated in FIGS. 1D-1F, are omitted. The omission is indicated by greyed blocks in FIG. 4.

Figure 3A:
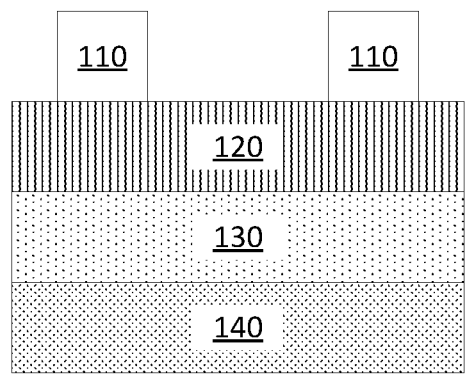
FIGS. 3A-3C illustrate cross-sectional views of a semiconductor device at various intermediate stages of an example sequence of process steps used to form a patterned etch mask and transfer the pattern to an underlying layer, in accordance with an embodiment of the invention.
Figure 3B:
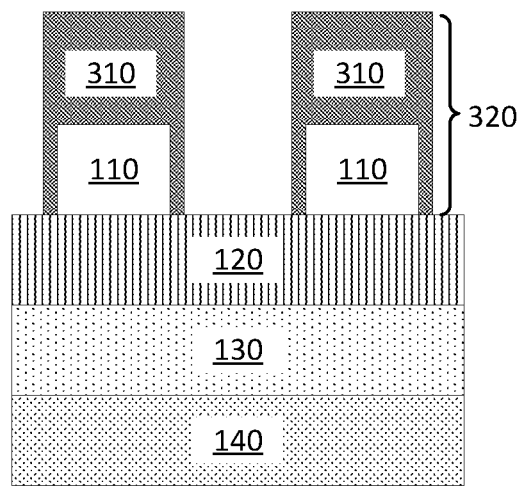
Figure 3C:
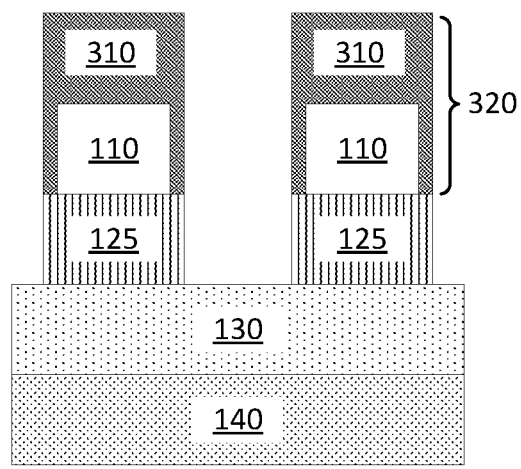

The sequence of process steps illustrated in FIG. 3A-3C starts at the step illustrated in FIG. 1B. As in FIG. 1B, in FIG. 3A, a photoresist film is patterned to form the patterned resist film 110 using, for example, EUV lithography.

In FIG. 3B, a combined smoothing and height-enhancing film 310 is formed selectively over the patterned resist film 110 using a suitable selective deposition technique, for example, using materials and processing similar to the selective deposition PECVD process used in forming the height-enhancing film 170, as described with reference to FIG. 1E. Similar to the height-enhancing film 170 in FIG. 1E, the combined smoothing and height-enhancing film 310 may be formed thicker over the top surface of the patterned resist film 110 relative to the thickness deposited over the sidewalls of the patterned resist film 110. The selectivity of the selective deposition process to the surface material may be utilized to expose a portion of the top surface of the underlying layer 120. As for forming the final etch mask 180 in FIG. 1E, in some embodiments, the combined smoothing and height-enhancing film 310 may also undergo a trim etch process or multiple cycles of selective deposition and trim in order to achieve the desired geometry. The combined smoothing and height-enhancing film 310 and the patterned resist film 110 collectively form the final etch mask 320, as illustrated in FIG. 3B.

In particular, using the selective deposition process, the thickness of the height-enhancing film 310 on the sidewalls of the patterned resist film 110 is controlled independently from the thickness of the height-enhancing film 310 on the top surface of patterned resist film 110. The growth of the film on the sidewalls is inhibited while the growth on the top surface is enhanced. The ratio of the thicknesses is adjusted using the directional nature of the plasma used to form the film.

In FIG. 3C the final etch mask 320 may be used to pattern the underlying layer 120 to form the patterned underlying layer 125 and expose a top surface of the target layer 130.

Figure 4:
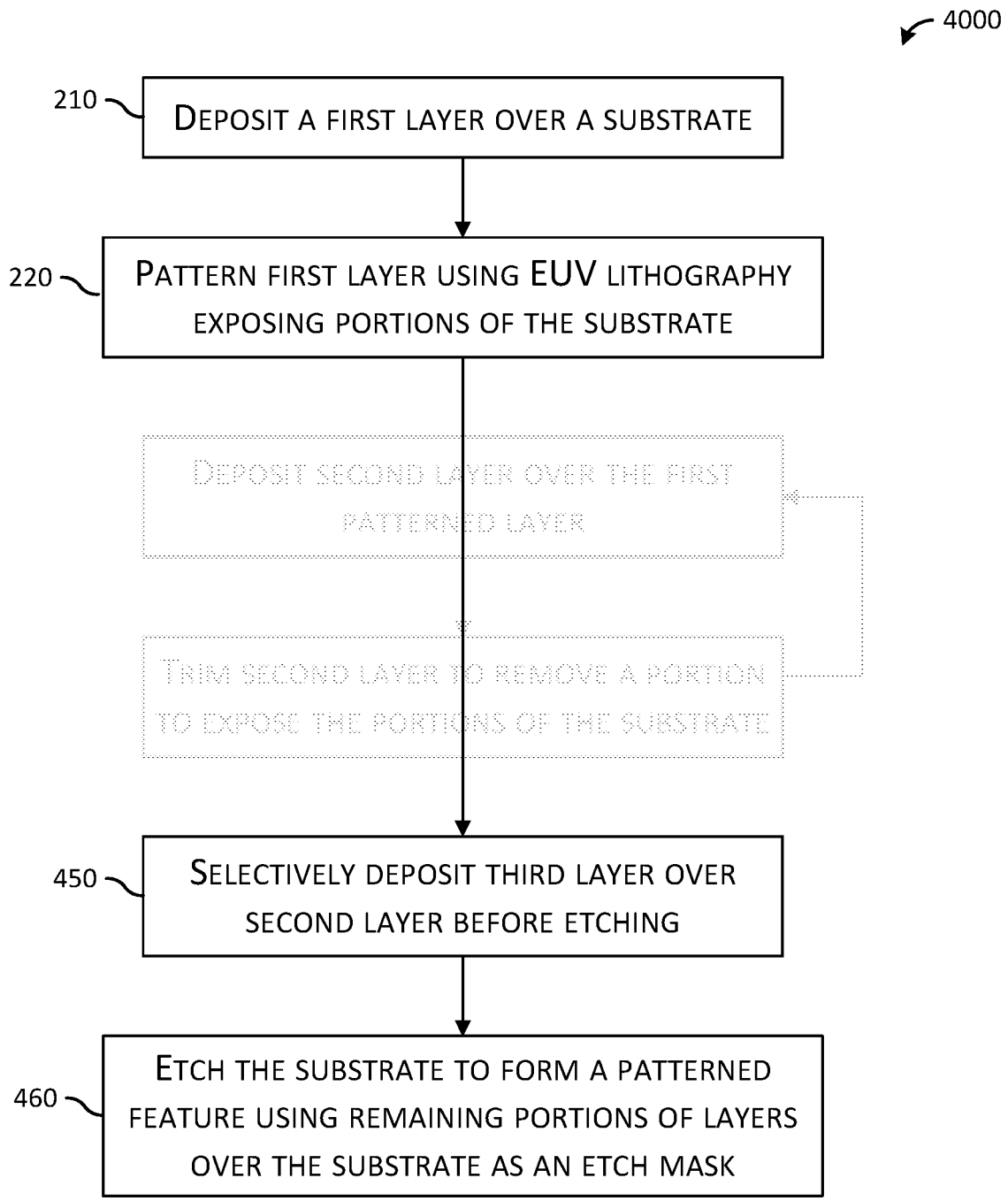
FIG. 4 is a flowchart illustrating an example process flow used to form a patterned etch mask and transfer the pattern to an underlying layer, in accordance with an embodiment of the invention.

The process sequence described above with reference to FIGS. 3A-3C is illustrated in the flowchart in FIG. 4 as the second fabrication flow 4000. The flowchart in FIG. 4 differs from the flowchart in FIG. 2 in that the process steps of the second fabrication flow 4000 omits the processing included in the first fabrication flow 2000 to form the second layer, as indicated in blocks 230 and 240 in FIG. 2.

Figure 5A:
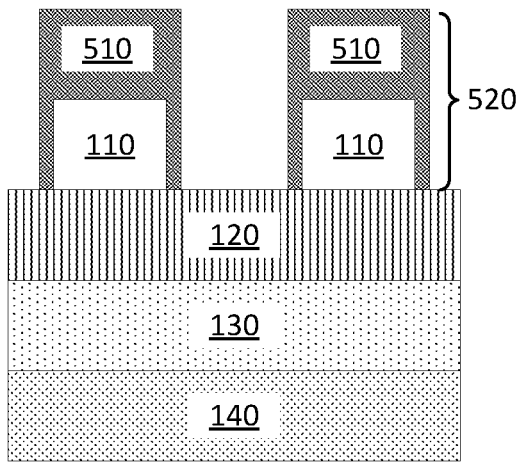
FIGS. 5A-5D illustrate cross-sectional views of a semiconductor device at various intermediate stages of an example sequence of process steps used to form a patterned etch mask and transfer the pattern to an underlying layer, in accordance with an embodiment of the invention.
Figure 5B:
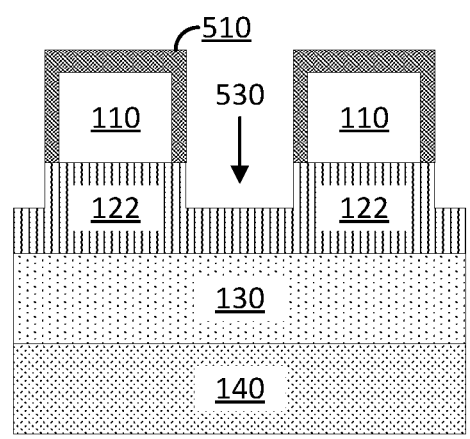
Figure 5C:
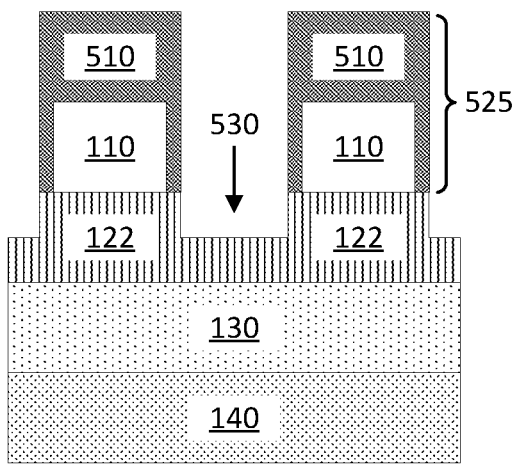
Figure 5D:
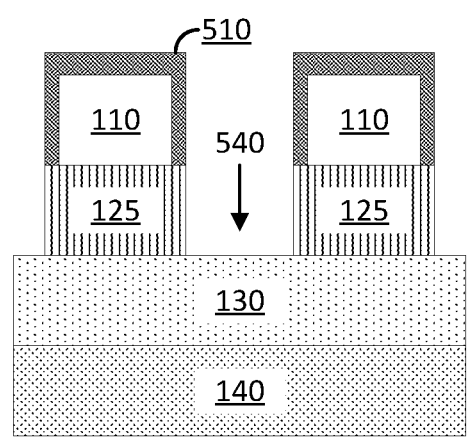
Figure 6:
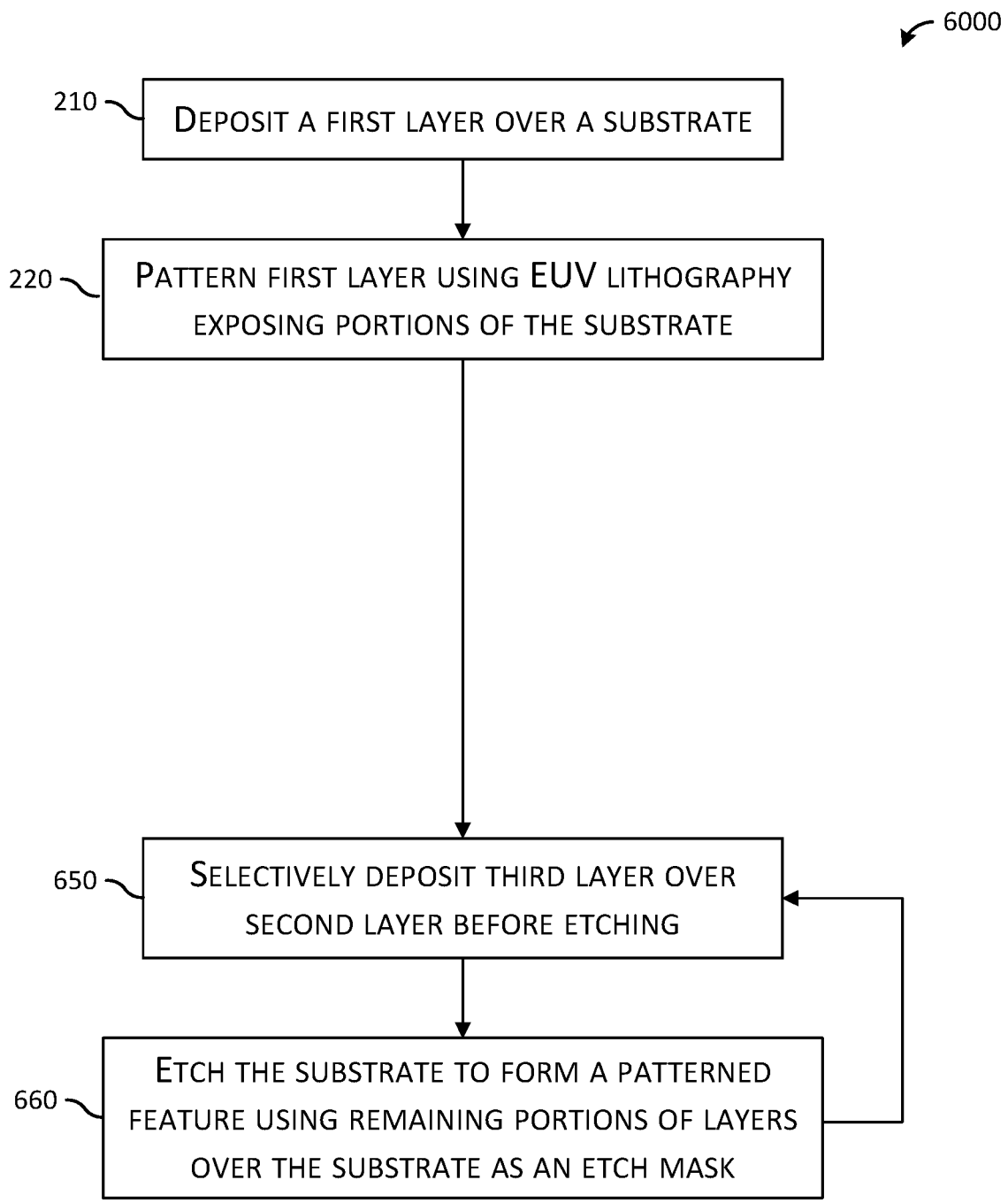
FIG. 6 is a flowchart illustrating an example process flow used to form a patterned etch mask and transfer the pattern to an underlying layer, in accordance with an embodiment of the invention.

Another embodiment, referred to as the third fabrication flow 6000, is described using the process sequence illustrated in FIGS. 5A-5D and the flowchart illustrated in FIG. 6. The third fabrication flow 6000 pertains to a situation, wherein the etch selectivity of an etch mask is insufficient to complete the etch process to a desired depth without losing the photoresist. The lack of etch selectivity is addressed in the third fabrication flow 6000 by a cyclic deposition and etch technique, as described further below. The example embodiment of the third fabrication flow 6000, described with reference to FIGS. 5A-5D, is a variation of the second fabrication flow 4000.

As illustrated in FIG. 5A, the final etch mask 520 of the third fabrication flow 6000, comprises the patterned resist film 110 and a combined smoothing and height-enhancing film 510. The final etch mask 520 is formed using process steps similar to those used to form the final etch mask 320 in FIG. 3B. In this example, the etch selectivity corresponding to the height of the final etch mask 520 may not be enough to complete the etch process of etching the underlying layer 120 to form a hard mask that may be used to pattern the target layer 130. In this example, completing etching the underlying layer 120 implies removing sufficient material to form an opening extending through the underlying layer 120 to expose a top surface of the target layer 130.

FIG. 5B shows a cross-sectional view illustrating a timed partial etch of the underlying layer 120 in the substrate, wherein material from the underlying layer 120 is removed to form a partially etched underlying film 122 and a cavity 530. The partial etch is timed such that the patterned resist film 110 remains protected although much of the material of the combined smoothing and height-enhancing film 510 has been lost during the partial etch step.

In FIG. 5C, the selective deposition process used to form the combined smoothing and height-enhancing film 510 is performed again to form a new final etch mask 525 having a restored height, similar to the height of the final etch mask 520 formed in a previous processing step illustrated in FIG. 5A.

The deposition and etch steps illustrated in FIGS. 5B and 5C may be cycled multiple times to progressively increase the depth of the cavity 530. FIG. 5D illustrates the structure after the cavity has extended through the underlying film to form an opening 540 that exposes a top surface of the target layer 130, thereby completing etching the underlying layer to form the patterned underlying layer 125 that may be subsequently used as a patterned hard mask to etch the target layer 130.

FIG. 6 illustrates a flowchart depicting the third fabrication flow 6000, an example of which has been described above with reference to FIGS. 5A-5D. As shown in the flowchart in FIG. 6, the processing sequence in the example of the third fabrication flow 6000 includes a deposition and etch cycle, wherein the deposition step is indicated in block 650 and the etch step is indicated in block 660.

The cyclic deposition and etch method of the third fabrication flow 6000 increases the etch selectivity of an etch mask formed by the second fabrication flow 4000. A similar method may also be applied to increase the etch selectivity of an etch mask formed by the first fabrication flow 2000 (illustrated in FIGS. 1 and 2). In other words, the embodiments of FIGS. 1-2 may be combined with the other embodiments such as in FIGS. 3-6.

Figure 7:
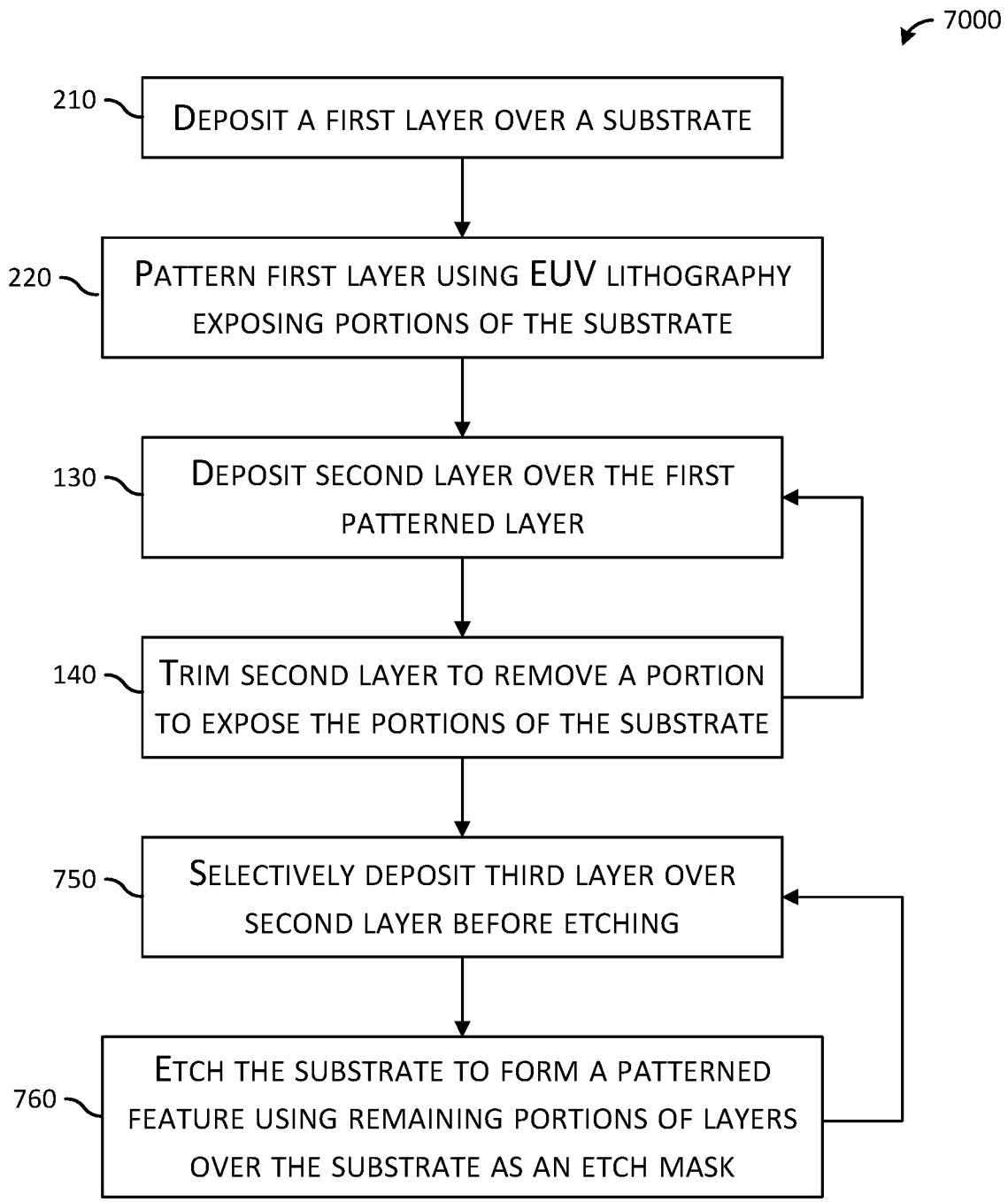
FIG. 7 is a flowchart illustrating an example process flow used to form a patterned etch mask and transfer the pattern to an underlying layer, in accordance with an embodiment of the invention.

A fourth fabrication flow 7000 incorporating such deposition and etch cycling is illustrated in the flowchart of FIG. 7. As indicated in block 750 of the flowchart in FIG. 7, a third layer (the height-enhancing film 170 in FIG. 1E) is selectively deposited after the cyclic trim etch used to form the trimmed smoothing film 160 is completed, similar to the first fabrication flow 2000 in FIG. 2. A final etch mask, similar to the final etch mask 180 in FIG. 1E, may then be used to partially etch the underlying layer 120 of the substrate, as indicated in block 760 of the fourth fabrication flow 7000. As shown in the flowchart in FIG. 7, the deposition and etch steps indicated in blocks 750 and 760, respectively, may be cycled multiple times to progressively increase the depth of the cavity formed by the partial etch of the underlying layer 120 till the structure illustrated in FIG. 3C is formed, wherein a top surface of the target layer 130 is exposed.

Advantageously, embodiments of the invention may be implemented without special hardware, for example, using direct current superposition. Embodiments of the invention may be used on any plasma etch chamber that is compatible with the chemistry used.

Example embodiments of the invention are summarized here. Other embodiments can also be understood from the entirety of the specification as well as the claims filed herein.

Example 1

A method of forming a semiconductor device, the method including: depositing a first layer over a substrate; patterning the first layer using an extreme ultraviolet (EUV) lithography process to form a patterned layer and expose portions of the substrate; in a plasma processing chamber, generating a first plasma from a gas mixture including $SiCl_4$ and one or more of argon, helium, nitrogen, and hydrogen; and exposing the substrate to the first plasma to deposit a second layer including a material comprising silicon over the patterned layer.

Example 2

The method of example 1, where the first layer is a photoresist layer and where patterning the first layer includes: exposing the first layer to an EUV light; and developing the first layer after the exposing to form the patterned layer.

Example 3

The method of one of examples 1 or 2, further including: forming a hard mask layer underneath the first layer; generating a second plasma using a second plasma process; and using the patterned layer and the second layer as an etch mask, etching the hard mask layer using the second plasma.

Example 4

The method of one of examples 1 to 3, where the first plasma and second plasma are generated in the plasma processing chamber.

Example 5

The method of one of examples 1 to 4, further including exposing the substrate to a trim process to remove portions of the second layer.

Example 6

The method of one of examples 1 to 5, further including depositing a third layer over the second layer, the third layer being selectively deposited over the second layer.

Example 7

The method of one of examples 1 to 6, where the first layer includes a first line edge roughness value, where the second layer includes a second line edge roughness value, where the first line edge roughness value is higher than the second line edge roughness value.

Example 8

The method of one of examples 1 to 7, further including: using the second layer and the patterned layer as a first etch mask, etching the substrate through a first portion of a layer to be patterned; exposing the substrate to a second plasma including the gas mixture to deposit a third layer including silicon over the patterned layer; and using the third layer, remaining portions of the second layer, and the patterned layer as a second etch mask, etching the substrate through a second portion of a layer to be patterned.

Example 9

A method of forming a semiconductor device, the method including: depositing a first layer over a substrate; patterning the first layer using an extreme ultraviolet (EUV) lithography process to form a patterned layer and expose portions of the substrate; using a first plasma process including SiCl4, performing a first deposition process to deposit a second layer over the patterned layer and the exposed portions of the substrate, the second layer including a material comprising silicon; using a second plasma process, performing a first trim process to remove portions of the second layer to expose the portions of the substrate; and using the remaining portions of the second layer as an etch mask, etching the substrate to form a patterned feature.

Example 10

The method of example 9, where, after the depositing, the second layer has a first thickness over a top surface of the patterned layer, and a second thickness over a top surface of the substrate.

Example 11

The method of one of examples 9 or 10, where the first thickness is greater than the second thickness.

Example 12

The method of one of examples 9 to 11, where the first thickness is between 1.5 times to five times the second thickness.

Example 13

The method of one of examples 9 to 12, where the trim process etches the portions of the second layer directly over the substrate faster than portions of the second layer directly over the patterned layer.

Example 14

The method of one of examples 9 to 13, further including: after performing the trim process, performing a second deposition process using the first plasma process including SiCl4 to deposit another second layer over the remaining portions of the second layer and the patterned layer and the exposed portions of the substrate; and using the second plasma process, performing a second trim process to remove portions of the another second layer to expose the portions of the substrate.

Example 15

The method of one of examples 9 to 14, further including: selectively depositing a third layer over the second layer before the etching.

Example 16

The method of one of examples 9 to 15, where the third layer includes silicon.

Example 17

The method of one of examples 9 to 16, where the third layer includes a different material than the second layer.

Example 18

A method of forming a semiconductor device, the method including: depositing a first layer over a substrate; patterning the first layer using an extreme ultraviolet (EUV) lithography process to form a patterned layer and expose portions of the substrate; using a first plasma process including SiCl4, selectively depositing a second layer over the patterned layer; and using the second layer as an etch mask, etching the substrate to form a patterned feature.

Example 19

The method of example 18, where the second layer includes silicon.

Example 20

The method of one of examples 18 or 19, further including: forming a hard mask layer underneath the first layer; generating a second plasma using a second plasma process; and using the patterned layer and the second layer as an etch mask, etching the hard mask layer using the second plasma, where the first plasma process and second plasma process are performed in a same plasma processing chamber.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A method of forming a semiconductor device, the method comprising:
depositing a first layer over a substrate comprising an underlying layer;
patterning the first layer using an extreme ultraviolet (EUV) lithography process to form a patterned layer and expose portions of the substrate;
in a plasma processing chamber, generating a first plasma from a gas mixture comprising $SiCl_4$ and one or more of argon, helium, nitrogen, and hydrogen; and exposing the substrate to the first plasma to deposit a second layer comprising silicon over the patterned layer;

performing a trim process to remove portions of the second layer;

after performing the trim process, in the plasma processing chamber, generating a second plasma from a gas mixture comprising SiCl$_4$ and one or more of argon, helium, nitrogen, and hydrogen; and exposing the substrate to the second plasma to deposit a third layer comprising silicon over the patterned layer.

2. The method of claim 1, wherein the first layer is a photoresist layer and wherein patterning the first layer comprises:

exposing the first layer to an EUV light; and developing the first layer after the exposing to form the patterned layer.

3. The method of claim 1, further comprising forming a hard mask layer as the underlying layer underneath the first layer.

4. The method of claim 1, wherein etching the substrate is performed in the plasma processing chamber.

5. The method of claim 1, wherein the third layer is selectively deposited over the second layer.

6. The method of claim 1, wherein the patterned layer defines a line feature, the line feature comprising a line edge roughness prior to depositing the second layer, and wherein depositing the second layer reduces the line edge roughness.

7. The method of claim 1, further comprising:

using the third layer, remaining portions of the second layer, and the patterned layer as a second etch mask, etching the substrate to extend the recess in the underlying layer.

8. A method of forming a semiconductor device, the method comprising:

depositing a first layer over a substrate;

patterning the first layer using an extreme ultraviolet (EUV) lithography process to form a patterned layer and expose portions of the substrate, the patterned layer comprising a top surface and sidewalls;

using a first plasma process comprising SiCl4, performing a first deposition process to deposit a second layer over the top surface and the sidewalls of the patterned layer and the exposed portions of the substrate, the second layer comprising silicon;

using a second plasma process, performing a first trim process to remove portions of the second layer to expose the portions of the substrate, the top surface and the sidewalls of the patterned layer remaining covered by the second layer;

after performing the first trim process, performing a second deposition process using the first plasma process comprising SiCl4 to deposit another second layer over the remaining portions of the second layer and the patterned layer and the exposed portions of the substrate;

using the second plasma process, performing a second trim process to remove portions of the another second layer to expose the portions of the substrate; and after performing the second trim process, using the remaining portions of the second layer as an etch mask, etching the substrate to form a patterned feature.

9. The method of claim 8, wherein the first trim process etches the portions of the second layer directly over the substrate faster than portions of the second layer directly over the patterned layer.

10. The method of claim 8, wherein, after the first deposition process, the second layer has a first thickness over the top surface of the patterned layer, and a second thickness over a top surface of the substrate.

11. The method of claim 10, wherein the first thickness is greater than the second thickness.

12. The method of claim 10, wherein the first thickness is between 1.5 times to five times the second thickness.

13. The method of claim 8, further comprising:

selectively depositing a third layer over the second layer before the etching.

14. The method of claim 13, wherein the third layer comprises silicon.

15. The method of claim 13, wherein the third layer comprises a different material than the second layer.

16. A method of forming a semiconductor device, the method comprising:

depositing a first layer over a substrate;

patterning the first layer using an extreme ultraviolet (EUV) lithography process to form a patterned layer and expose portions of the substrate, the patterned layer comprising a top surface and sidewalls;

depositing a middle layer over the patterned layer;

trimming the middle layer;

using a first plasma process comprising SiCl4, selectively depositing a second layer over the trimmed middle layer; and using the second layer, the trimmed middle layer, and the patterned layer as an etch mask, etching the substrate to form a patterned feature.

17. The method of claim 16, wherein the second layer comprises silicon.

18. The method of claim 16, further comprising:

forming a hard mask layer underneath the first layer; and generating a second plasma using a second plasma process, wherein the etching of the substrate to form the patterned feature comprising etching the hard mask layer using the second plasma, and wherein the first plasma process and second plasma process are performed in a same plasma processing chamber.

\* \* \* \* \*